(12) United States Patent
Kamo et al.

(10) Patent No.: US 7,276,757 B2
(45) Date of Patent: Oct. 2, 2007

(54) SEMICONDUCTOR DEVICE WITH SHALLOW TRENCH ISOLATION AND METHOD OF FABRICATING THE SAME

(75) Inventors: Ryuichi Kamo, Mie (JP); Hisashi Watanobe, Mie (JP); Tadashi Iguchi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/060,542

(22) Filed: Feb. 18, 2005

(65) Prior Publication Data

US 2005/0221578 A1    Oct. 6, 2005

(30) Foreign Application Priority Data

Feb. 19, 2004  (JP) .............................. 2004-043363

(51) Int. Cl.
*H01L 29/788* (2006.01)
(52) U.S. Cl. ............................. 257/315; 257/E21.179
(58) Field of Classification Search ...................... None
See application file for complete search history.

(56) References Cited

U.S. PATENT DOCUMENTS 6,222,225 B1    4/2001    Nakamura et al.

| 6,399,985 | B2 | 6/2002 | Horita et al. |
| 6,548,866 | B2 | 4/2003 | Noguchi |
| 2002/0027245 | A1* | 3/2002 | Noguchi ..................... 257/345 |

FOREIGN PATENT DOCUMENTS

| JP | 2002-33476 | 1/2002 |
| JP | 2002-124563 | 4/2002 |

* cited by examiner

*Primary Examiner*—Scott B. Geyer
*Assistant Examiner*—Elias Ullah
(74) *Attorney, Agent, or Firm*—Oblon, Spivak, McClelland, Maier & Neustadt, P.C.

(57) ABSTRACT

A semiconductor device includes a semiconductor substrate including a first upper surface, a first insulating film including an upper portion including a first side wall having a first upper end and a second upper surface having a second upper end, a second insulating film formed on the first upper surface of the substrate, a floating gate electrode including a third upper surface, a second side wall and a lower surface, a third insulating film, and a control gate electrode. A height of the second upper end is lower than a height of the third upper surface and higher than a height of the first upper end relative to the first upper surface. The first upper end is located at a position higher than the lower surface of the floating gate electrode. The entire second side wall is aligned with the first side wall of the first insulating film.

10 Claims, 9 Drawing Sheets

SEMICONDUCTOR DEVICE WITH SHALLOW TRENCH ISOLATION AND METHOD OF FABRICATING THE SAME

CROSS-REFERENCE TO RELATED APPLICATION

This application claims priority to Japanese patent application No. 2004-43363, filed Feb. 19, 2004, the content of which is incorporated herein by reference.

BACKGROUND OF THE INVENTION

1. Field of the Invention

The present invention relates to a semiconductor device in which trenches are formed in a semiconductor substrate and an insulator is buried in the trenches so that an element isolation region is formed and a method of fabricating such a semiconductor device.

2. Description of the Related Art

Figure 6A:
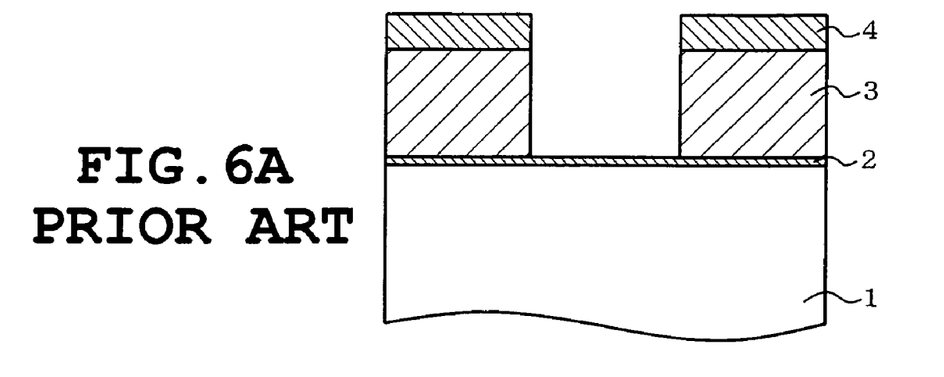
FIGS. 6A to 6E are longitudinal sections taken across the trench in the prior art and showing steps of the fabricating process.

The semiconductor device of the above-described type includes non-volatile memories such as flash memories. In the non-volatile memories, an etching process requires high precision in a step of forming an element isolation region in a memory cell forming area. However, a conventional fabricating step involves factors which cannot improve the precision in the following points. FIGS. 6A to 6E illustrate typical sectional structures of a semiconductor device according to a conventional fabricating method. In FIG. 6A, firstly, a silicon oxide film 2 is formed on a silicon substrate 1. Subsequently, a polycrystalline silicon film 3 doped with phosphor (P) and a silicon nitride film 4 are formed on the silicon oxide film 2 in turn. Next, a photoresist is formed by a photolithography process into a predetermined pattern, whereby a mask is formed. The silicon nitride film 4 is etched by a reactive ion etching (RIE). The polycrystalline silicon film 4 is then etched with the silicon nitride film 4 serving as a mask so that the silicon oxide film 2 is exposed. This state is shown in FIG. 6A.

Figure 6B:
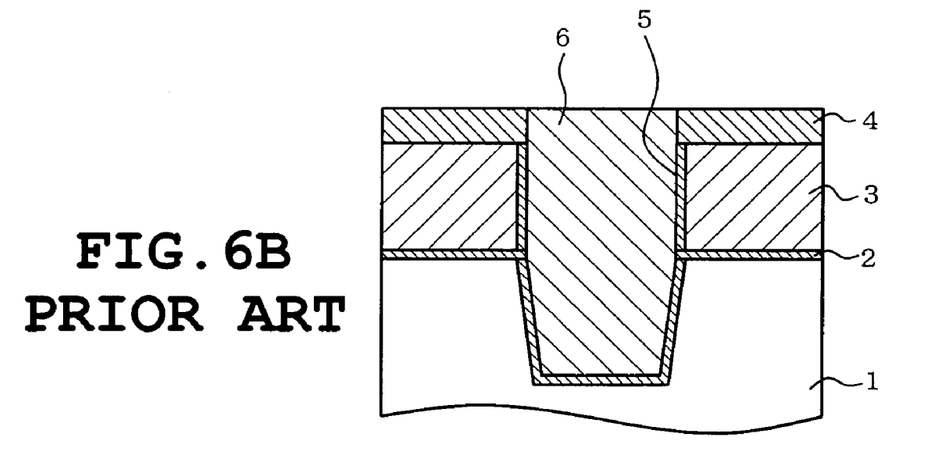

Subsequently, the silicon oxide film 2 and the silicon substrate 1 are etched so that a trench is formed in the silicon substrate. A silicon oxide film 5 is formed on the inner surface of the trench. Consecutively, a silicon oxide film 6 is deposited in the trench by a high density plasma (HDP) process. The silicon oxide film 6 is polished by a chemical mechanical polish (CMIP) process thereby to be planarized. Thereafter, the structure is heated in an atmosphere of nitrogen so as to be formed into the state as shown in FIG. 6B.

Figure 6C:
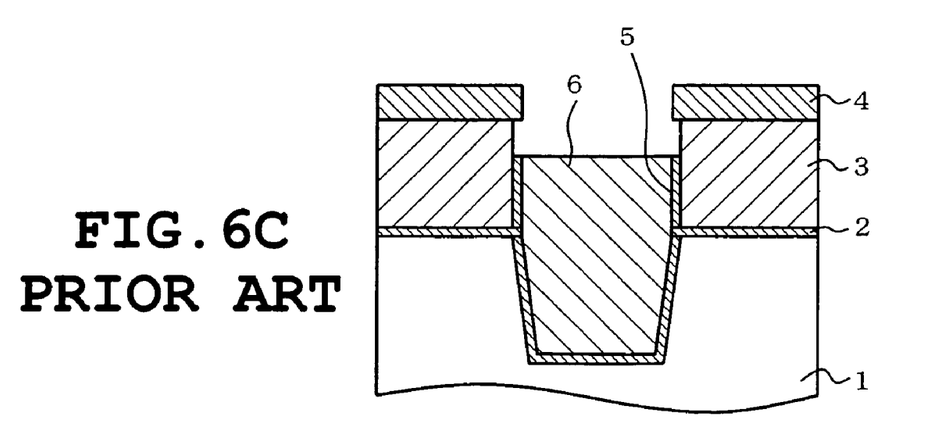

In the aforementioned state, wet etching is carried out for the silicon oxide film 6 using a solution of buffered hydrofluoric acid (BHF). The etching is carried out until a predetermined height or level is achieved on the basis of a surface of the silicon substrate 1. Consequently, an upper surface of the silicon oxide film 6 is located in the middle of the polycrystalline silicon film 3. This state is shown in FIG. 6C. Since the foregoing is the wet etching process, the silicon oxide film 5 is etched as well as the silicon oxide film 6. Accordingly, part of the polycrystalline silicon film 3 is exposed as shown in FIG. 6C.

Figure 6D:
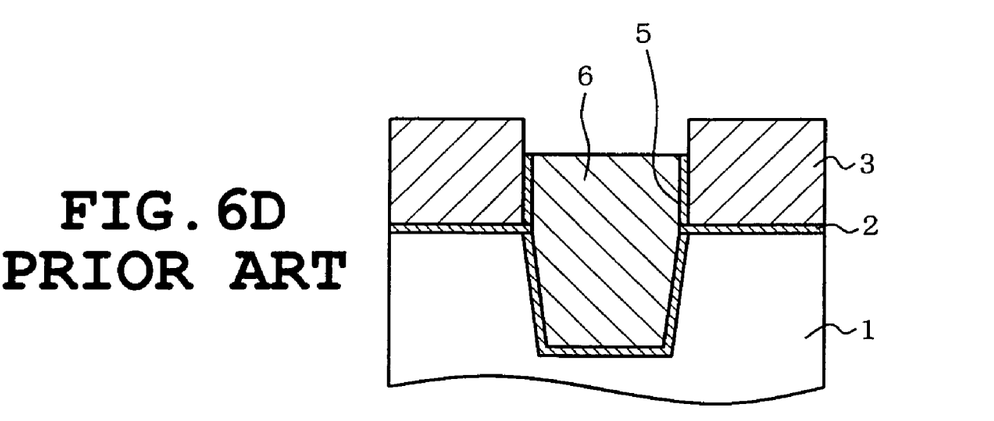
Figure 6E:
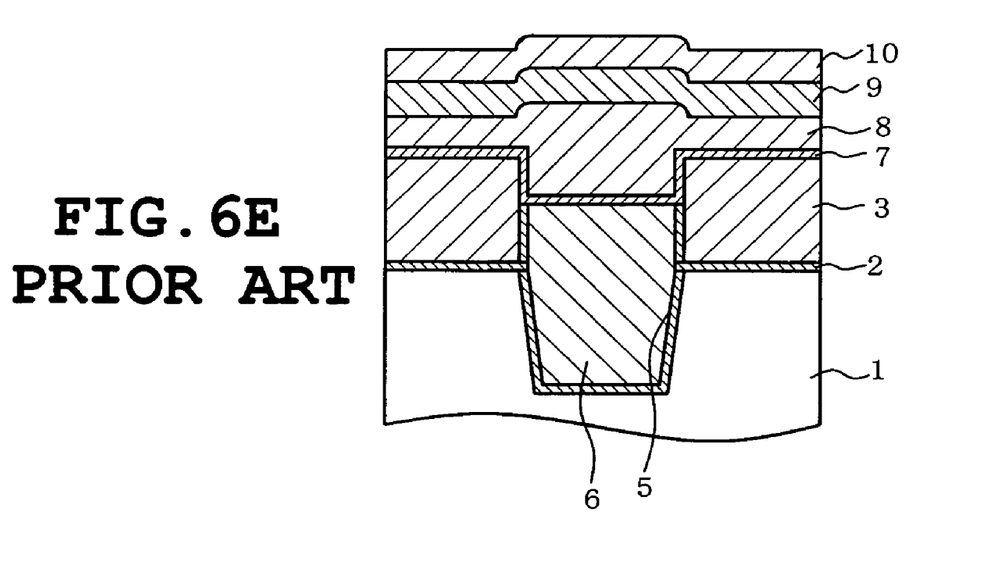

Subsequently, the silicon nitride film 4 is etched by phosphating thereby to be eliminated. As a result, the structure as shown in FIG. 6D is obtained. Consecutively, an ONO film 7, a polycrystalline silicon film 8 doped with phosphor, a tungsten silicide (WSi) film 9 and a silicon nitride film 10 are sequentially deposited on one another so that the structure as shown in FIG. 6E is obtained. The ONO film 7 is a three-layer film composed of a silicon oxide film, silicon nitride film and silicon oxide film.

Thereafter, the silicon nitride film 10 is etched by the RIE process. The WSi film 9, polycrystalline silicon film 8, ONO film 7 and polycrystalline silicon film 3 are etched by the RIE process with the etched silicon nitride film 10 serving as a mask. A silicon oxide film is then formed on a side wall of the gate electrode. Thus, a flash memory is made through the foregoing steps.

For example, JP-A-2002-033476 and JP-A-2002-124563 each disclose a technique of STI which is an element isolation region formed by burying, with the silicon oxide film, the relatively shallow trench formed in the silicon substrate.

However, the foregoing conventional techniques have the following defects. More specifically, the silicon nitride film 4 serving as a stopper film for CMP cannot be polished uniformly when the upper surface of the silicon oxide film 6 is flattened. As a result, when the silicon oxide film 6 is etched by the solution of BHF, an amount of etching is difficult to control, whereupon the height from the surface of the silicon substrate 1 becomes non-uniform.

The non-uniform height from the surface of the silicon substrate 1 results in variations in a coupling ratio of the silicon substrate to a gate electrode which will be formed later. This results in an increase in the write time in the characteristic of the device, which increase is undesirable in the practical use.

BRIEF SUMMARY OF THE INVENTION

Therefore, an object of the present invention is to provide a semiconductor device in which control performance in the control of an amount of etching can be improved when etching is performed for an insulating film buried in a trench formed in the semiconductor substrate, whereupon a stable device characteristic can be obtained, and a method of fabricating the semiconductor device.

The present invention provides a semiconductor device comprising a semiconductor substrate including a first upper surface and a trench formed in the first upper surface, a first insulating film including a lower portion buried in the trench and an upper portion protruding from the first upper surface of the semiconductor substrate, the upper portion including a first side wall having a first upper end portion and a second upper surface having a second upper end portion located at a center of the second upper surface, a second insulating film which is formed on the first upper surface of the semiconductor substrate and is adjacent to the first insulating film, a floating gate electrode formed on the second insulating film and including a third upper surface, a second side wall and a lower surface facing the second insulating film, a third insulating film formed on the floating gate electrode, and a control gate electrode formed on the third insulating film, wherein a height of the second upper end portion is lower than a height of the third upper surface and is higher than a height of the first upper end portion relative to the first upper surface, the first upper end portion is located at a position higher than the lower surface of the floating gate electrode, and the entire second side wall is aligned with the first side walls of the first insulating film.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

A first embodiment of the present invention will be described with reference to FIGS. 1 to 4E. The invention is applied to a non-volatile memory such as a flash memory in the first embodiment.

Figure 2A:
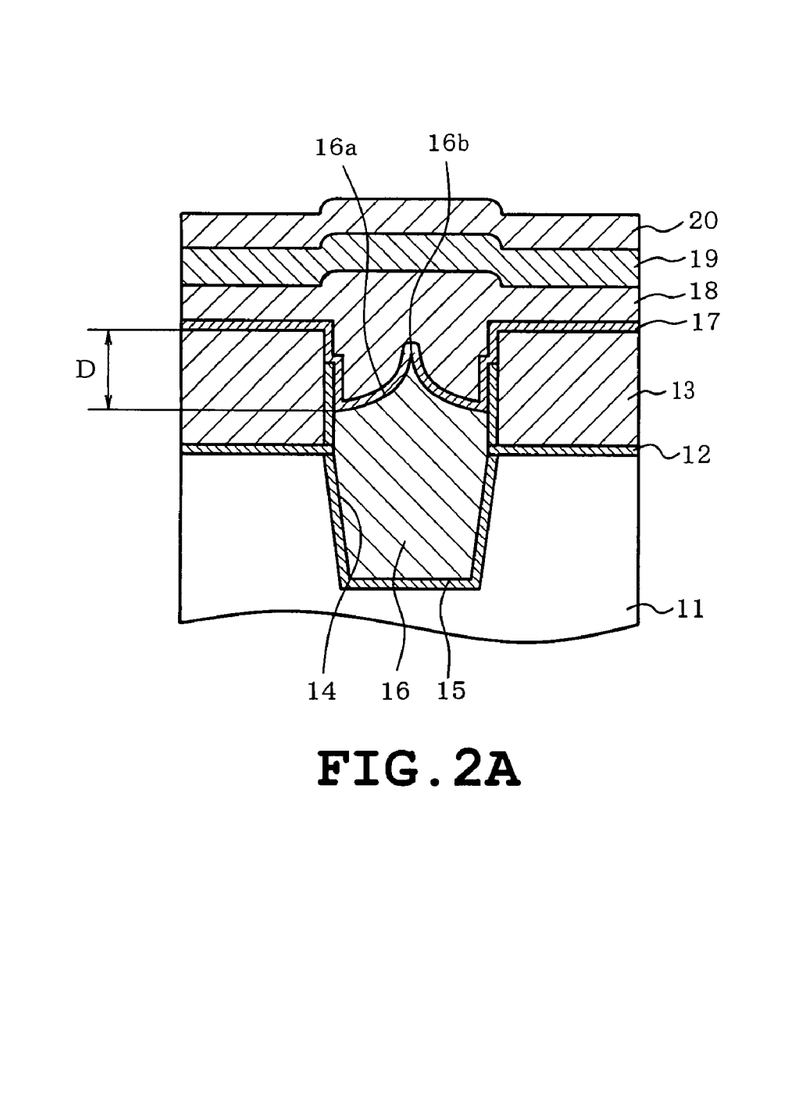
FIGS. 2A and 2B are longitudinal sections taken along line 2A-2A and line 2B-2B respectively.
Figure 2B:
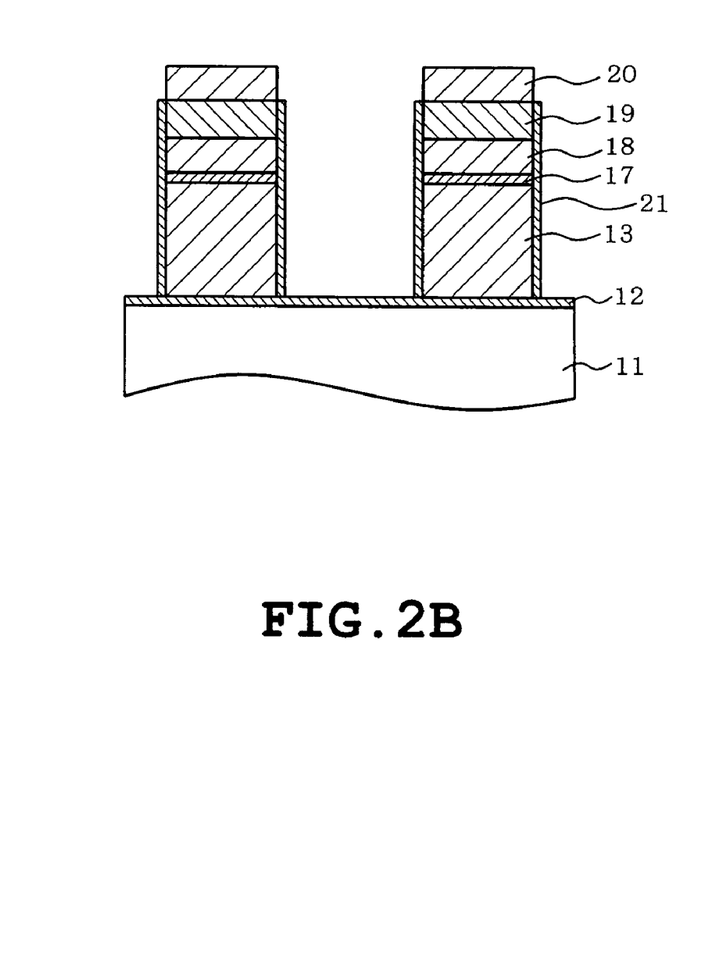

Referring to FIGS. 2A and 2B, a first silicon oxide film 12 (first insulating film) serving as a gate oxide film is formed on a surface of a silicon substrate 11 serving as a semiconductor substrate. The first silicon oxide film 12 has a film thickness of 8 nm. A first polycrystalline silicon film 13 doped with phosphor is formed on the first silicon oxide film 12. The first polycrystalline silicon film 13 serves as a floating gate and has a film thickness of 165 nm.

A trench 14 is formed in the silicon substrate 11, the first silicon oxide film 12 and the first polycrystalline silicon film 13 so as to have a predetermined depth in the silicon substrate. A second silicon oxide film 15 with a film thickness of 6 nm is formed on a bottom and both sidewalls of the trench 14 so as to extend to a predetermined level. A third silicon oxide film 16 (second insulating film) is buried in the trench 14 so as to reach a predetermined depth.

The third silicon oxide film 16 has an upper surface formed into two inclined surfaces 16a extending from opposite ends of the trench 14 to a central top 16b thereof respectively. Each inclined surface 16a includes a part adjacent to the end of the trench 14 or an upper surface end. Each inclined surface 16a is formed so that the upper surface end thereof is located lower than an upper surface of the first polycrystalline silicon film 13 and higher than the upper surface of the silicon substrate 11. More specifically, each inclined surface 16a is formed so that the upper surface end is located at a position a predetermined depth D lower than the upper surface of the first polycrystalline silicon film 13. Each inclined surface 16a is formed so as to be downwardly convex or so that an inclination thereof is gradually reduced from the central portion toward the upper surface end thereof.

An oxide-nitride-oxide (ONO) film 17 is formed on upper surfaces of the first polycrystalline silicon film 13 and the third silicon oxide film 16 buried in the trench 14. The ONO film 17 comprises three films, that is, a silicon oxide film with a film thickness of 5.5 nm, a silicon nitride film with a film thickness of 8 nm and a silicon oxide film with a film thickness of 5.3 nm. A second polycrystalline silicon film 18 added with phosphor is formed on the ONO film 17 so as to bury the trench 14. The second polycrystalline silicon film 18 has a film thickness of 80 nm. A tungsten silicide (WSi) film 19 is formed on the second polycrystalline silicon film 18 and has a film thickness of 70 nm. A second silicon nitride film 20 is formed on the WSi film 19 and has a film thickness of 300 nm, whereupon a control gate is formed. Further, a fourth silicon oxide film 21 is formed on each sidewall of the gate electrode.

An upper surface of the third silicon oxide film 16 buried in the trench 14 has a characteristic configuration in the aforementioned structure. This configuration results from employment of the etching process of the present invention in the fabrication process as will be described later. One of purposes of the etching process is to improve an forming accuracy in a step of forming the third silicon oxide film 16 so that the end thereof is located at the position lower than the upper surface of the first polycrystalline silicon film 13 by the predetermined depth D.

An accurate depth D, when obtained, improves an accuracy in the area of a portion of the second polycrystalline silicon film 18 opposed to the first polycrystalline silicon film 16 with the ONO film 17 formed therebetween. Consequently, variations in a coupling ratio which is important as a device characteristic can be reduced, whereupon a memory cell with a stable characteristic can be obtained.

Figure 3A:
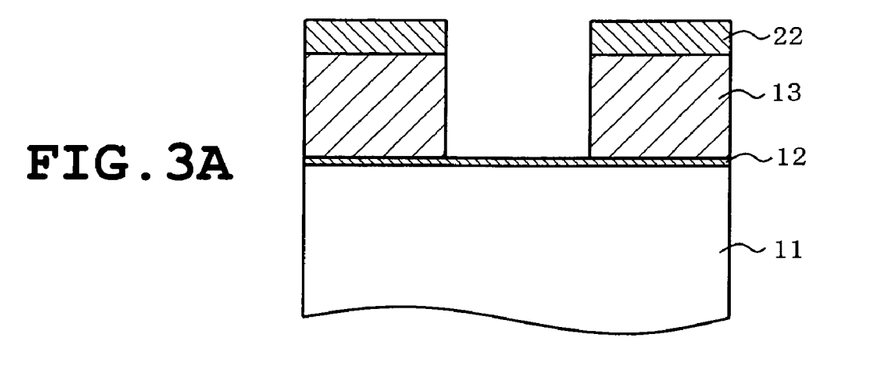
FIGS. 3A to 3E are longitudinal sections taken across the trench and showing steps of the fabricating process.
Figure 4A:
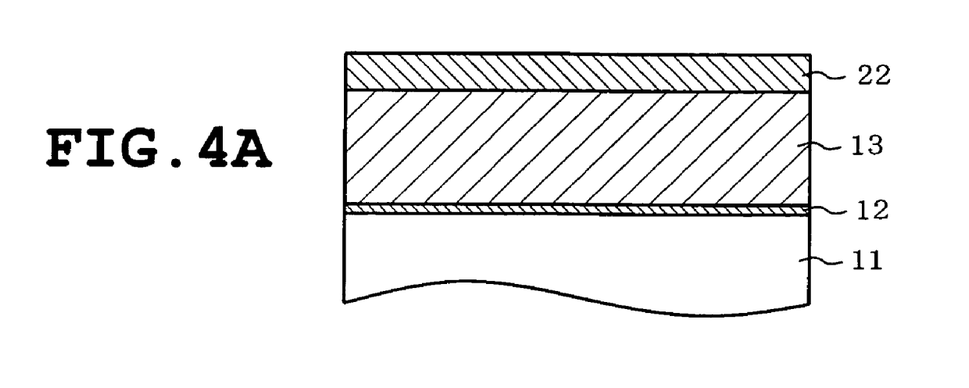
FIGS. 4A to 4E are longitudinal sections taken along the active region and showing steps of the fabricating process.

The fabricating process of the aforesaid memory cell will now be described. The states as shown in FIGS. 3A and 4A are obtained as follows. Firstly, the silicon substrate 11 is heated in an atmosphere of moisture at the temperature of 750° C. so that the first silicon oxide film 12 with the film thickness of 8 nm is formed on the surface of the silicon substrate 11. The first silicon oxide film 12 functions as the gate oxide film. Subsequently, the first polycrystalline silicon film 13 with a thickness of 165 nm is deposited on the first silicon oxide film 12 by pressure-reduced chemical vapor deposition (RP-CVD). The first polycrystalline silicon film 13 is doped with phosphor (H) as impurity. A first silicon nitride film 22 with a film thickness of 70 nm is deposited on the first polycrystalline silicon film 13.

Subsequently, a photoresist is processed into a predetermined pattern by an ordinary photolithography process. The first silicon nitride film 22 is processed by a reactive ion etching (RIE) process with the patterned photoresist serving as a mask. Consecutively, the films 13, 12 and 11 are etched with the first silicon nitride film 22 serving as a mask, so that the trench 14 is formed in the silicon substrate 11. FIGS. 3A and 4A show the sections when the etching has reached the first polycrystalline silicon film 13.

Figure 3B:
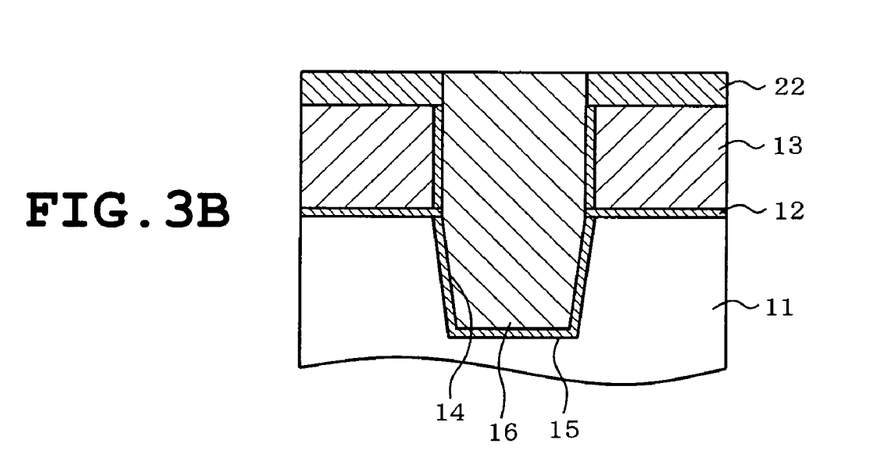
Figure 4B:
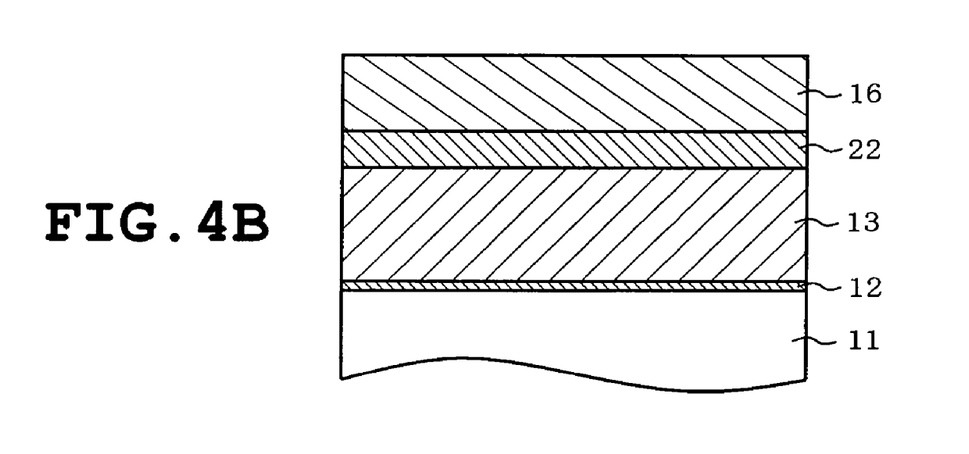
Figure 4C:
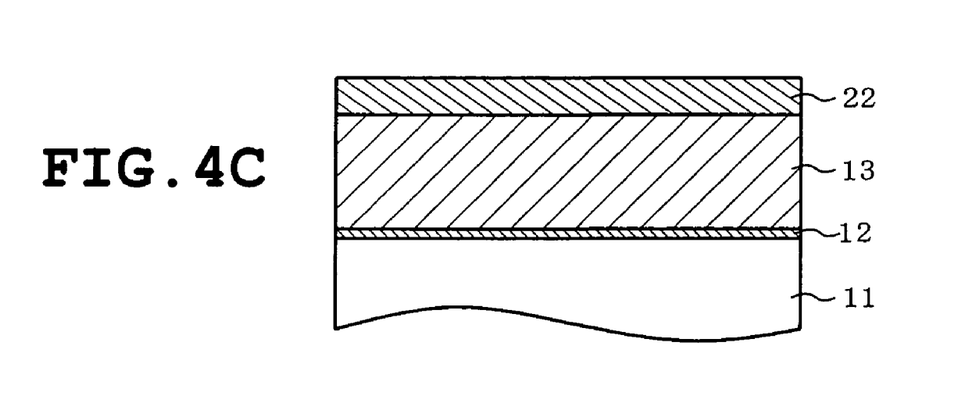

Subsequently, the structure is heated in an atmosphere of oxygen at 1000° C. so that the second silicon oxide film 15 with a film thickness of 6 nm is formed on an outer wall of the trench 14. The third silicon oxide film 16 with the film thickness of 700 nm is deposited on the second silicon oxide film 15 by a high density plasma (HDP) process, whereupon the structure as shown in FIG. 4B is obtained. The third silicon oxide film 16 is then planarized by a chemical mechanical polish (CMP) process. Thereafter, the structure is thereafter heated in an atmosphere of nitrogen so that the structures as shown in FIGS. 3B and 4C are obtained.

Figure 3C:
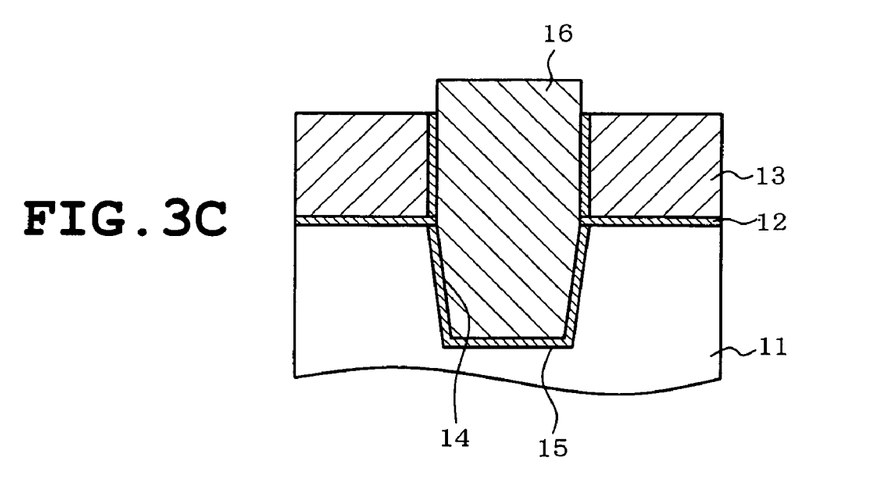
Figure 3D:
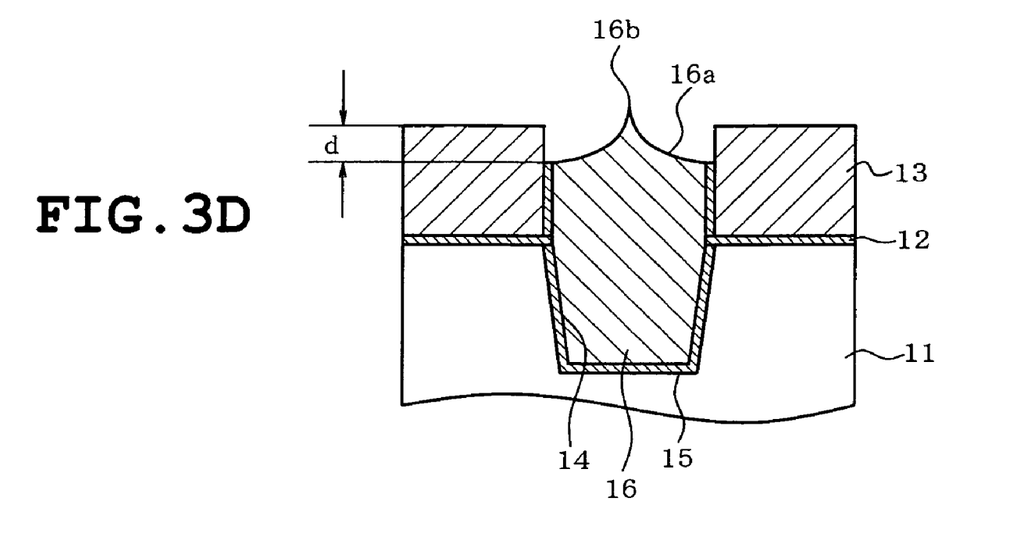
Figure 3E:
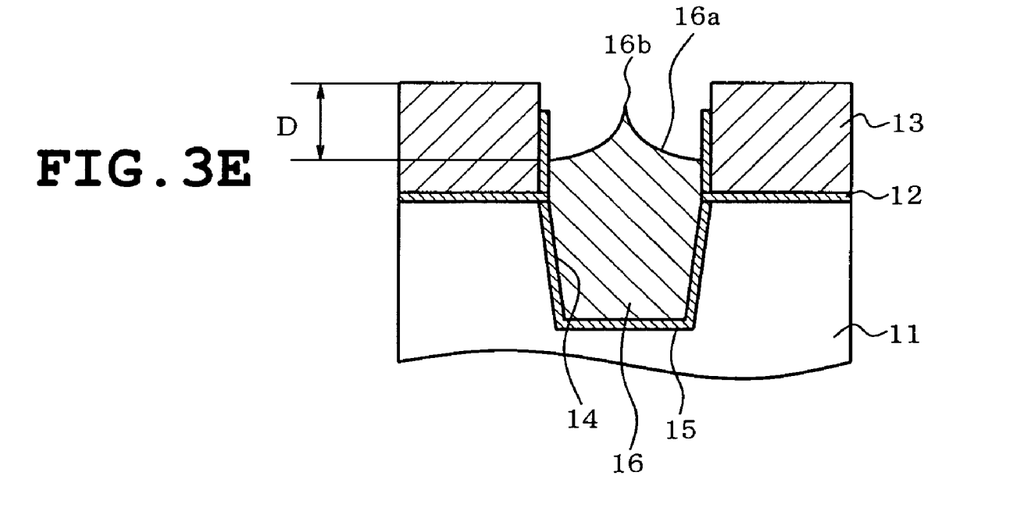
Figure 4D:
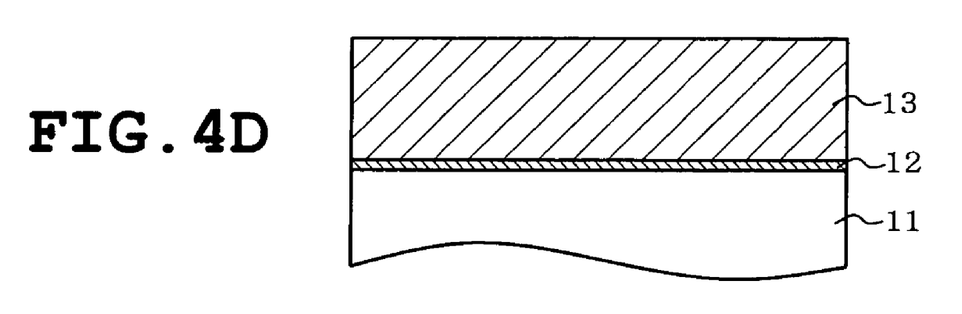

The structure is then immersed in a solution of buffered hydrofluoric acid (BHF) in order that the third silicon oxide film on the first silicon nitride film 22 may completely be removed. The first silicon nitride film 22 is then removed by the phosphating at 150° C. In this state, as shown in FIG. 3C, the upper surface of the third silicon oxide film 16 protrudes over the trench 14, whereupon the opposite sides of the third silicon oxide film 16 are exposed. Subsequently, as shown in FIGS. 3D and 4D, the structure is immersed in BHF, whereby the third silicon oxide film 16 is etched so that a desired level thereof is obtained relative to the upper surface of the silicon substrate 11. In this etching, the protruding third silicon oxide film 16 as shown in FIG. 3 is wet-etched. The etching is caused to progress isotropically from an exposed portion of the third silicon oxide film 16, whereupon the etching starts from the upper surface and the exposed sides of the silicon oxide film 16 and an amount of etching is increased with lapse of time.

Consequently, the etching progresses downward while the arc-shaped inclined face 16a is being formed which extends from the end toward the central upper surface and has a downwardly convex section, as shown in FIG. 3D. In this case, a depth d (see FIG. 3D) from the end of the trench 14 is obtained by an etching amount proportionate to time. Thus, the inclined faces 16a extending from the respective ends of the trench 14 are joined together in the form of a roof with the centrally formed top 16b. Thereafter, the third silicon oxide film 16 is processed by RIE process so as to be etched until the depth D is reached between the opening of the trench 14 and the ends of the upper surface of the third silicon oxide film 16, as shown in FIG. 3E.

Figure 4E:
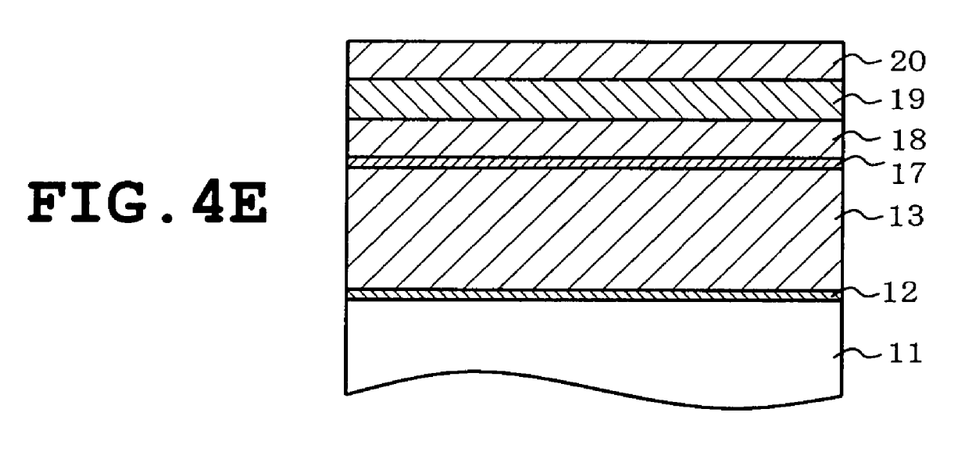

Subsequently, as shown in FIG. 4E, the ONO film 17, second polycrystalline silicon film 18, and WSi film and second silicon nitride film 20 are sequentially deposited on the first polycrystalline silicon film 13 by RP-CVD. The ONO film 17 comprises a 5.5-nm-thick silicon oxide film, 8-nm-thick silicon nitride and 5.3-nm-thick silicon oxide film. The second polycrystalline silicon film 18 has a film thickness of 8 nm. The WSi film 19 has a film thickness of 70 nm. The second silicon nitride film 20 has a film thickness of 300 nm.

Subsequently, a photoresist is patterned into a desired configuration by the photolithography process. The second silicon nitride film 20 is processed by the RIE process with the patterned photoresist serving as a mask. The silicon substrate 11 is then exposed to $O_2$ plasma so that the photoresist is removed. The WSi film 19, second polycrystalline silicon film 18, ONO film 17 and first polycrystalline silicon film 13 are then processed by the RIE process with the second silicon nitride film 20 serving as a mask and heated in an atmosphere of oxygen at 1000° C., whereby the fourth silicon oxide film 21 is formed on the sidewalls of the gate electrode. As a result, the structures as shown in FIGS. 2A and 2B can be obtained.

According to the foregoing embodiment, when the third silicon oxide film 16 buried in the trench 14 is etched, the first silicon nitride film 22 is removed so that the third silicon oxide film 16 protrudes. Thereafter, the third silicon oxide film 16 is then immersed in the solution of BHF. As a result, the third silicon oxide film 16 can be etched isotropically from the surface of the first polycrystalline silicon film 13. Consequently, an amount of etching in the direction of depth of the end can accurately be controlled on the basis of the etching time.

As the result of the above processing, variations in the coupling ratio can be reduced and accordingly, a stable write can be carried out. Thus, the device characteristic can be rendered stable.

Figure 5A:
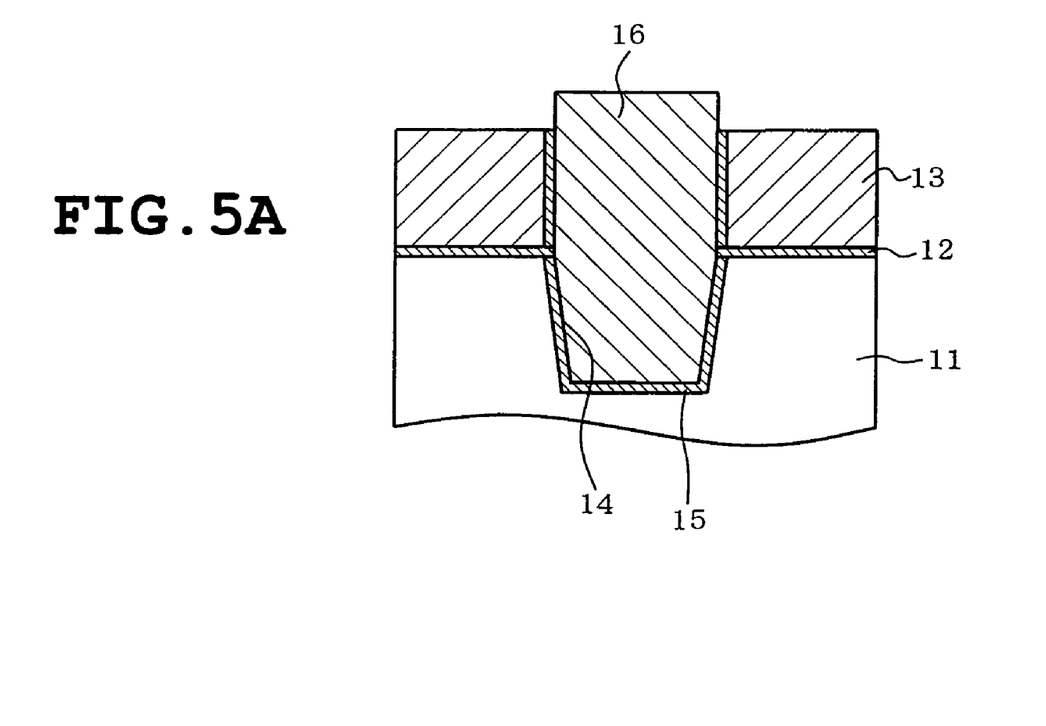
FIGS. 5A and 5B are longitudinal sections taken across the trench in the memory cell of the flash memory in accordance with a second embodiment of the invention and showing steps of the fabricating process.
Figure 5B:
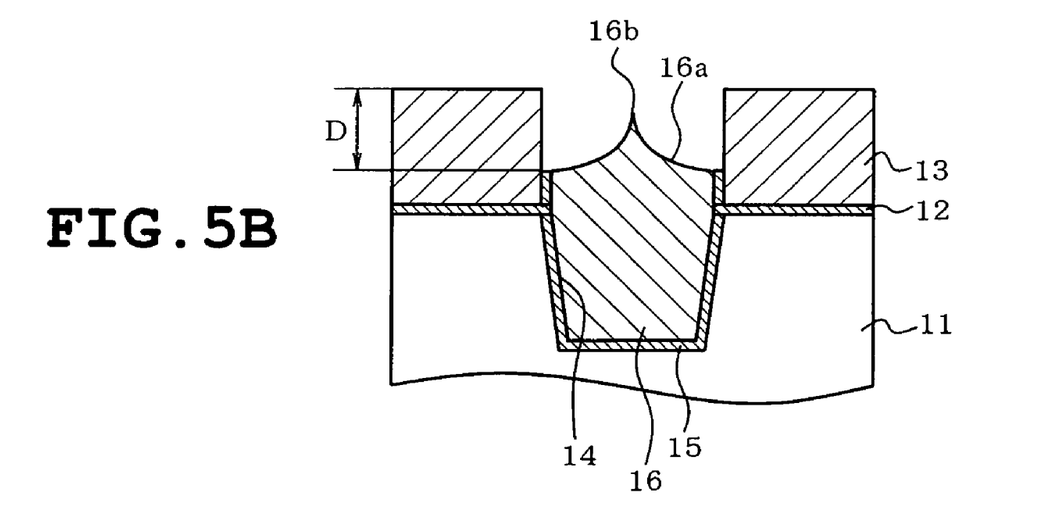

FIGS. 5A and 5B illustrate a second embodiment of the invention. The second embodiment differs from the first embodiment in the fabricating method. More specifically, the process by the RIE process is eliminated from the stage from the state of FIG. 3C to the state of FIG. 3E, and only the immersion in the solution of BHF is executed so that the third silicon oxide film is etched until the depth D is reached.

When the immersion in the solution of BHF is carried out in the state of FIG. 5A corresponding to FIG. 3C, the etching progresses isotropically and accordingly, the second silicon oxide film 15 formed on the sidewalls is also etched. Since the first embodiment includes the process by the RIE process in which anisotropic etching is executed, the second silicon oxide film 15 is hard to etch. On the other hand, the second silicon oxide film 15 is etched in the wet etching using the solution of BHF.

The object can be achieved in the case where the second embodiment is employed when the control of etching amount includes only the control of time period of etching by the use of BHF. Consequently, the fabricating process can be simplified since the etching by the RIE process is eliminated in the second embodiment.

The invention should not be limited to the foregoing embodiments but may be modified or expanded as follows. The invention may be applied to semiconductor devices which exclude flash memories and in which an insulating film is buried in a trench formed as STI and etching is carried out.

Figure 1:
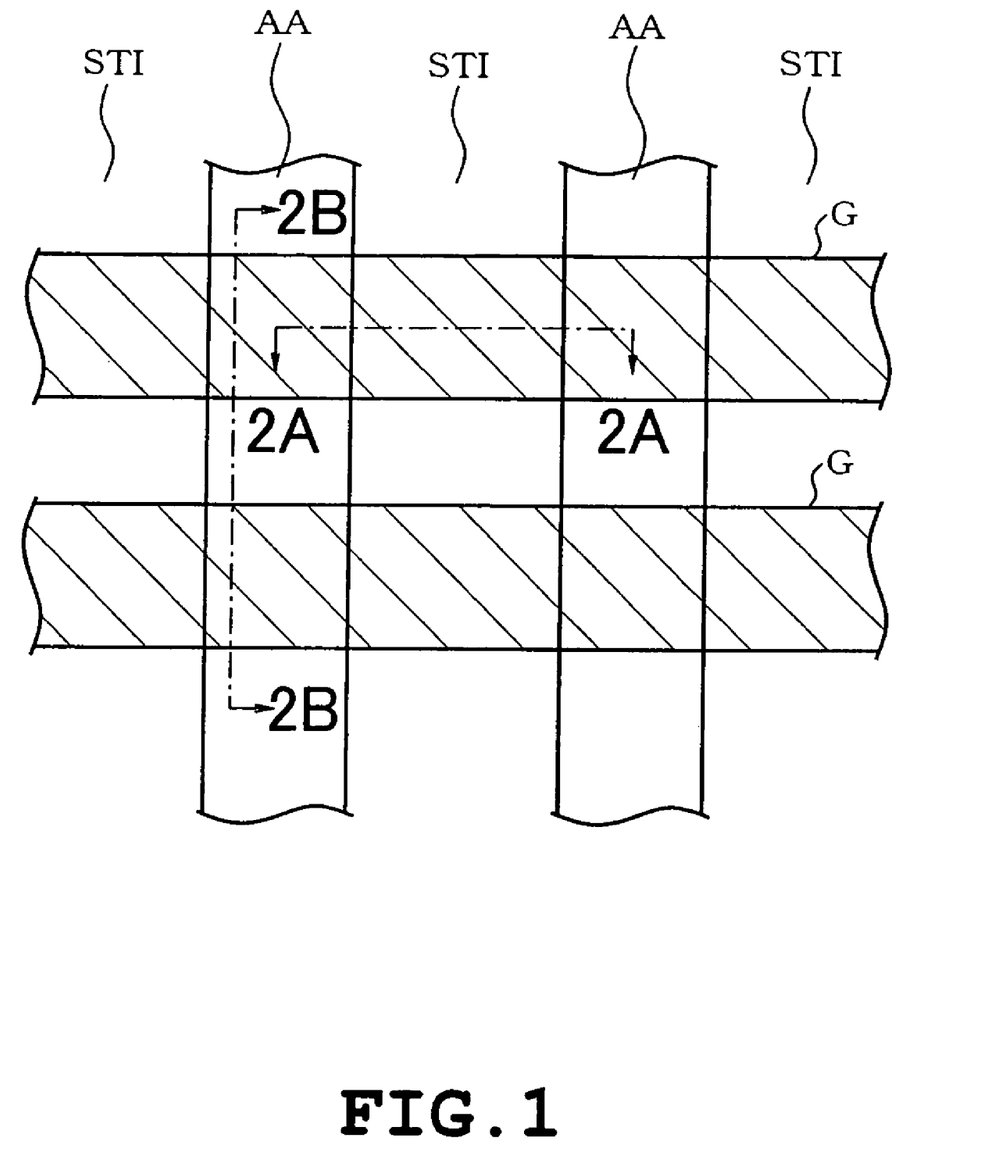
FIG. 1 is a schematic plan view of a memory cell of the flash memory in accordance with a first embodiment of the present invention.

In the state as shown in FIG. 1, etching is carried out using a solution of BHF so as to progress isotropically. Subsequently, another etching process may be employed in addition to the RIE process.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
    a semiconductor substrate including a first upper surface and a trench formed in the first upper surface;
    a first insulating film including a lower portion buried in the trench and an upper portion protruding from the first upper surface of the semiconductor substrate, the upper portion including a first side wall having a first upper end portion and a second upper surface having a second upper end portion located at a center of the second upper surface;
    a second insulating film which is formed on the first upper surface of the semiconductor substrate and is adjacent to the first insulating film;
    a floating gate electrode formed on the second insulating film, and including a third upper surface, a second side wall and a lower surface facing the second insulating film;
    a third insulating film formed on the floating gate electrode; and
    a control gate electrode formed on the third insulating film, wherein
    a height of the second upper end portion is lower than a height of the third upper surface and is higher than a height of the first upper end portion relative to the first upper surface, the first upper end portion is located at a position higher than the lower surface of the floating gate electrode, and the entire second side wall is aligned with the first side walls of the first insulating film.

2. The semiconductor device according to claim 1, wherein the second upper surface of the second insulating film has a configuration that an inclination thereof is gradually reduced from the second upper end portion toward the upper end portion.

3. The semiconductor device according to claim 1, further comprising a silicon oxide film formed between the second insulating film and the second side wall of the floating gate electrode.

4. The semiconductor device according to claim 1, wherein the second insulating film includes a silicon oxide film.

5. The semiconductor device according to claim 1, wherein the floating gate electrode includes a polycrystalline silicon film.

6. A semiconductor device, comprising:
- a semiconductor substrate including a first upper surface and a trench formed in the first upper surface;
- a first insulating film including a lower portion buried in the trench and an upper portion protruding from the first upper surface of the semiconductor substrate, the upper portion including a pair of first side walls, each first side wall having a first upper end portion, respectively, and a second upper end portion located between the first upper end portions;
- a pair of second insulating films formed on the first upper surface of the semiconductor substrate and located at both sides of the first insulating film;
- a pair of floating gate electrodes, each of which formed on one of the second insulating films and including a second upper surface, a second side wall and a lower surface, respectively;
- a pair of third insulating films, each of which is formed on one of the floating gate electrodes, respectively; and
- a control gate electrode formed on the second insulating films, wherein
- a height of the second upper end portion is lower than a height of the second upper surface and is higher than a height of the first upper end portions relative to the first upper surface, each first upper end portion is located at a position higher than one of the lower surfaces of the floating gate electrodes, and each of the entire second side wall is aligned with one of the first side walls, respectively.

7. The semiconductor device according to claim 6, wherein the second upper surface of the second insulating film has a configuration that an inclination thereof is gradually reduced from the second upper end portion toward the first upper end portion.

8. The semiconductor device according to claim 6, further comprising silicon oxide films formed between the second insulating film and the second side walls of the floating gate electrode.

9. The semiconductor device according to claim 6, wherein the second insulating film includes a silicon oxide film.

10. The semiconductor device according to claim 6, wherein each floating gate electrode includes a polycrystalline silicon film.

* * * * *